United States Patent [19]
Gelsomini

[11] Patent Number: 5,082,802
[45] Date of Patent: Jan. 21, 1992

[54] METHOD OF MAKING A MEMORY DEVICE BY PACKAGING TWO INTEGRATED CIRCUIT DIES IN ONE PACKAGE

[75] Inventor: Tito Gelsomini, Reiti, Italy

[73] Assignee: Texas Instruments Incorporated, Dallas, Tex.

[21] Appl. No.: 585,583

[22] Filed: Sep. 19, 1990

Related U.S. Application Data

[60] Division of Ser. No. 213,463, Jun. 29, 1988, Pat. No. 5,014,112, which is a continuation of Ser. No. 797,270, Nov. 11, 1985, abandoned.

[51] Int. Cl.⁵ .................. H01L 21/56; H01L 21/58; H01L 21/60
[52] U.S. Cl. .................. 437/217; 437/211; 437/205; 437/51
[58] Field of Search ............. 437/207, 220, 205, 206, 437/207, 208, 180, 182, 183, 217

[56] References Cited

U.S. PATENT DOCUMENTS

| | | | |
|---|---|---|---|
| 3,955,023 | 5/1976 | Blakely | 174/68.5 |
| 3,984,860 | 10/1976 | Logue | 357/70 |
| 4,038,488 | 7/1977 | Lin | 357/80 |
| 4,056,681 | 11/1977 | Cook, Jr. | 357/80 |
| 4,113,578 | 9/1978 | Del Monte | 437/195 |
| 4,195,195 | 3/1980 | de Miranda et al. | 357/70 |
| 4,241,360 | 12/1980 | Hambor et al. | 357/80 |
| 4,264,917 | 4/1981 | Ugon | 357/80 |
| 4,585,157 | 4/1986 | Belcher | 228/180.2 |
| 4,764,804 | 8/1988 | Sahara et al. | 437/209 |
| 4,862,322 | 8/1989 | Bickford et al. | 357/75 |
| 4,878,106 | 10/1989 | Sachs | 357/74 |

FOREIGN PATENT DOCUMENTS

| | | | |
|---|---|---|---|
| 55-48954 | 4/1980 | Japan | 357/70 |
| 56-137665 | 10/1981 | Japan | 357/70 |
| 58-141544 | 8/1983 | Japan | 357/70 |
| 59-172262 | 9/1984 | Japan | 357/70 |
| 60-260142 | 12/1985 | Japan | 357/70 |

Primary Examiner—Olik Chaudhuri
Assistant Examiner—David E. Graybill
Attorney, Agent, or Firm—Ronald O. Neerings; Lawrence J. Bassuk; Richard L. Donaldson

[57] ABSTRACT

A pair of like, semiconductor integrated circuit dies, such as DRAMS, have second level bonding pads formed over their active surfaces in mirror images of one another. The dies then become bonded to opposite sides of frame bonding pads of a lead frame to double the capacity of a normally encapsulated integrated circuit. The normal die bonding pads of the circuit dies are arranged identical to one another, and a patterned and etched second level of metal forms second level lands over the die bonding pads, the mirror image second level bonding pads and second level leads connecting corresponding second level lands to second level pads. A pair of 256K DRAMS can be connected either 256K×2 or 512K×1 by use of dummy second level pads for DATA-IN/OUT and ROW ADDRESSES STROBE connections.

23 Claims, 4 Drawing Sheets

METHOD OF MAKING A MEMORY DEVICE BY PACKAGING TWO INTEGRATED CIRCUIT DIES IN ONE PACKAGE

This is a division of application Ser. No. 07/213,463, filed June 29, 1988, now U.S. Pat. No. 5,014,112 which is a continuation of application Ser. No. 06/797,270, filed Nov. 11, 1985, abandoned.

BACKGROUND

The present invention relates to a method of packaging semiconductor integrated circuit chips, or, as they are sometimes referred to, dies more particularly, to forming and encapsulating such dies.

In the fabrication of semiconductor circuits normally a silicon slice is divided up into a number of dies, typically about 150, each of which are later separated and encapsulated. In the encapsulation process the bonding pads on each die are attached by means of gold thread to the pin leads of a lead frame with the die resting in a central die pad in the frame. Following the threading operation the lead frame and die are encased in epoxy with the pins of the lead frame extending outwardly and the epoxy cured. The pins are then trimmed and bent into shape. The rapid trend towards putting more circuitry into a given size of package indicates a need to develop a means for placing more than 1 die in a single package.

Accordingly, a principal object of the present invention is to improve the packaging of VLSI devices. It is a further object of the present invention to provide a method of packaging which increases the amount of circuitry housed in a single package for VLSI devices.

SUMMARY OF THE INVENTION

According to the invention there is provided a method of packaging VLSI devices which includes depositing a second level metal layer onto an active surface of each of two identical semiconductor circuit dies, patterning, and etching a plurality of second level bonding pads, second level bonding lands contacting bonding pads of the dies and second level pad leads interconnecting the second level bonding pads to respective second level bonding lands of the second level metal. Each second level pad is associated with one of the second level lands formed on a true die and there is a corresponding second level pad associated with an equivalent second level pad on a mirror die. The latter or mirror second level pad is positioned on the active surface of the mirror die such that it contacts the corresponding second level pad on the true die when the active surfaces of the true and mirror dies face each other and the second level pads thereon are aligned. At least one second level pad on the true die aligns with a dummy second level pad of the mirror die that is not connected to a second level land on the mirror die and at least one second level pad on the mirror die other than the dummy second level pad thereon aligns with a dummy second level pad on the true die which is not connected to a second level land. A lead frame is formed with a plurality of pins and frame pads connected to corresponding ones of the pins such that the frame pads are formed on both opposed flat surfaces of the lead frame and are alignable with the second level pads on the dies. The second level pads of each of the two dies are each bonded to a corresponding lead frame pad so as to be in electrical contact therewith. The lead frame and attached dies are encapsulated and the lead pins trimmed and formed.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
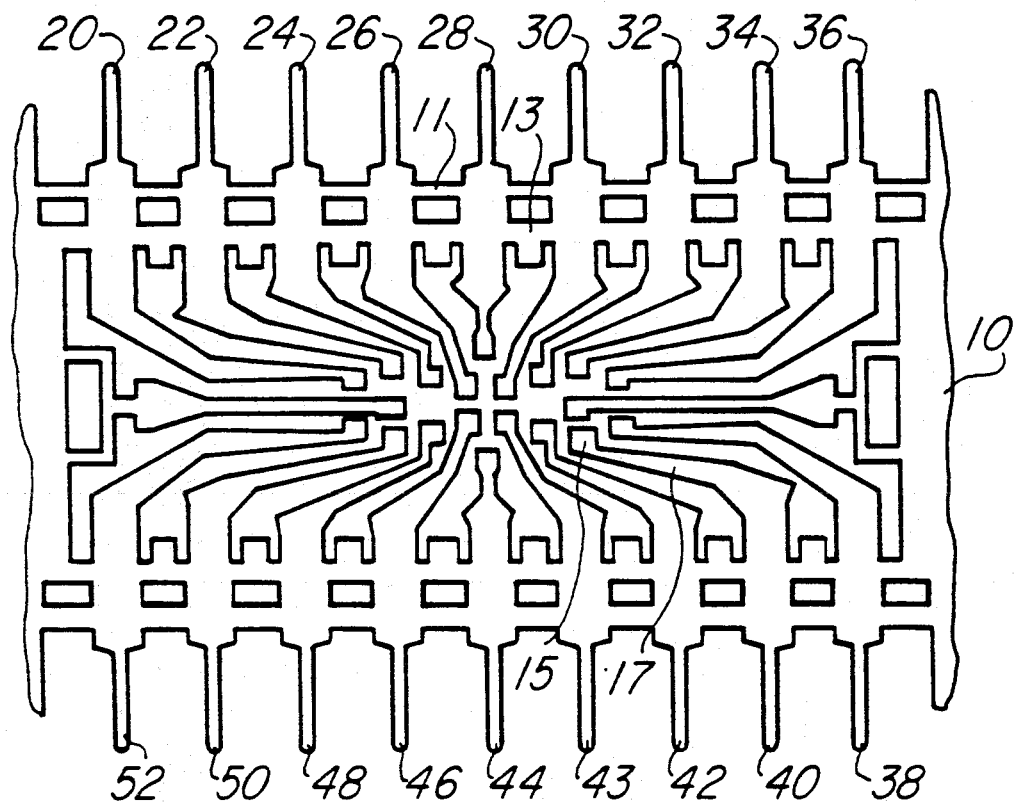
FIG. 1 is a plan view of a lead frame.

Referring to FIG. 1 there is shown a lead frame 10 made of conductive material which is one of a plurality of interconnected multiple lead frames in sheet form (not shown). Each lead frame 10 has a plurality of frame bonding pads 15 connected by frame leads 17 to corresponding pins 20, 22, etc. Each pin is coupled to adjacent pins by an inner web 13 and an outer web 11 which support the frame structure prior to encapsulation.

Figure 2:
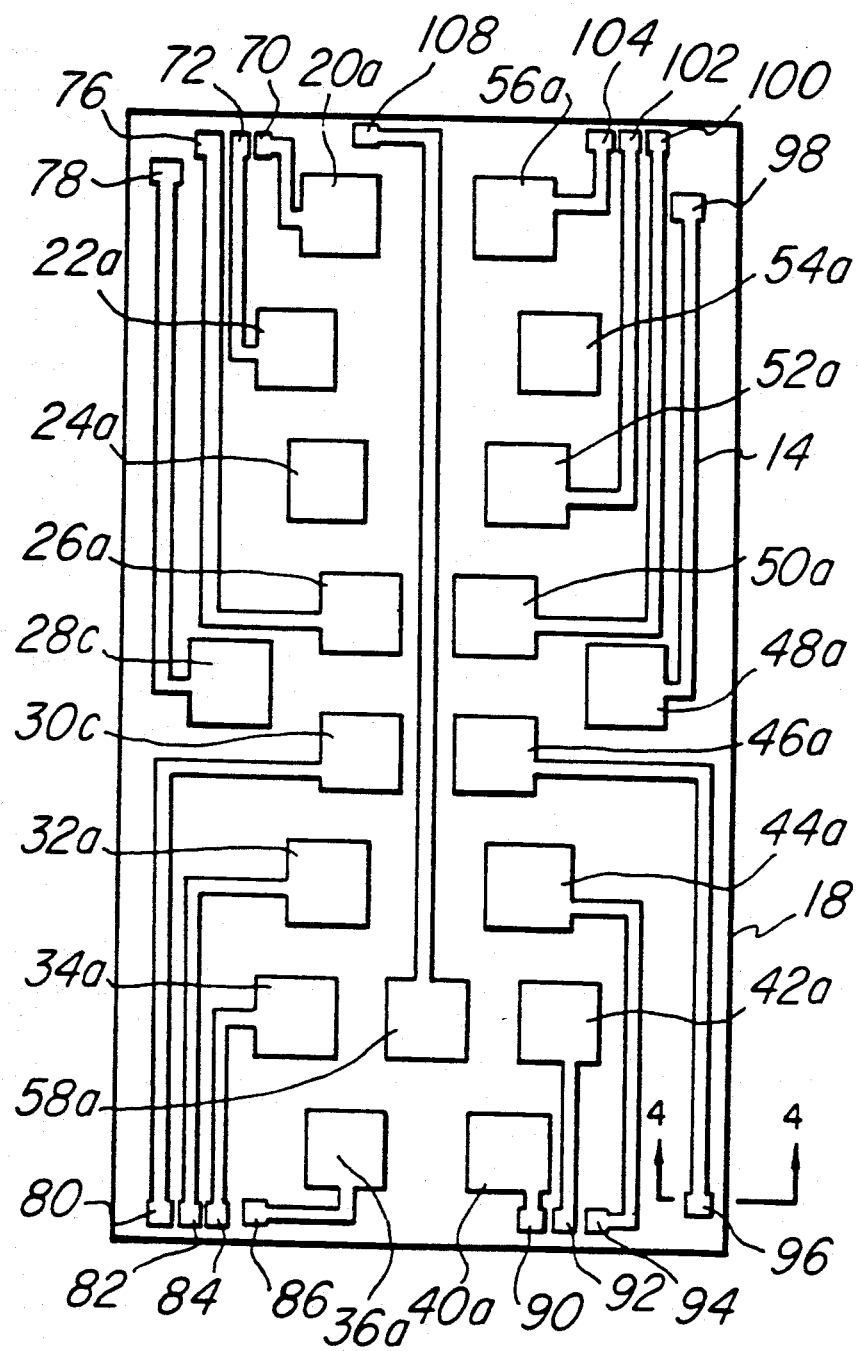
FIG. 2 is a plan view of a die with second level lands, leads and pads formed on one surface thereof.

Referring to FIG. 2, there is shown a die 18 with a plurality of second level bonding lands 70, 72, 76, etc. at either end thereof. On the active surface of the die 18 there is deposited a second level layer of metal consisting of a lower 1,000 Angstroms layer of chromium, a 5,000 Angstrom layer of copper and an 8,000 Angstrom layer of gold. The metal layer is patterned and etched to form a plurality of spaced apart metal second level pads 20a, 22a, 24a, etc., lands 70, 72, etc and leads 14 interconnecting the second level pads and lands. The area of said bonding pads is at least 400 square mil.

Figure 3:
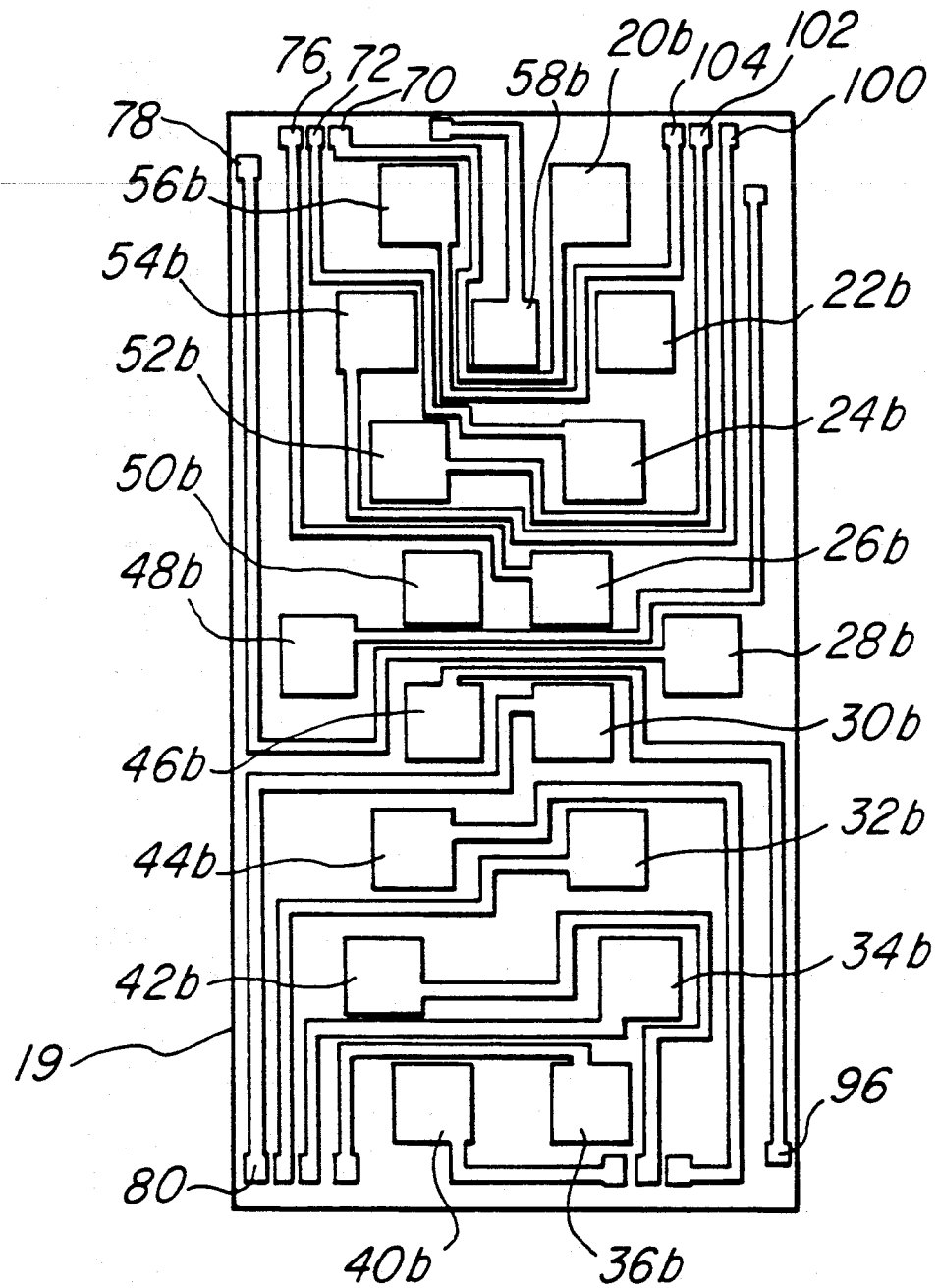
FIG. 3 is a plan of a die with second level lands, leads and pads and the pads being laid out in the mirror image of those of FIG. 2.

Referring to FIG. 3 there is shown a die 19 with a plurality of second level lands 70, 72, 76. Similar to the process outined for die 18, a second level metal is patterned, and etched to form a spaced apart array of second level pads 20b, 22b, 24b, 26b. . . which are connected to second level lands 70, 72, 76, etc. The latter are the equivalent bonding lands as those of like reference numbers on die 18. However, pads 20b, 22b, 26b, etc. are arranged so that when the active surface of die 18 is juxtaposed to that of die 19, the second level pads on die 18 align with corresponding second level pads on die 19. However, second level pads 24a and 54a of die 18 and 22b and 50b on die 19 are dummy pads in that they do not connect to any lands. In addition, second level pad 58a on die 18 and 58b on die 19 are provided to allow an optional connection to the back side of respective dies 18 and 19.

Figure 4:
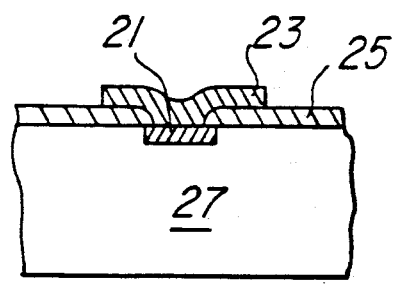
FIG. 4 is an elevation view taken along line 4-4 of FIG. 2 showing only detail with respect to the die bonding pad.

Referring to FIG. 4 there is shown a typical metal die bonding pad 21 on a portion of a silicon die 27 exposed through a hole in a protective oxide coating 25 and a metal second level land 23 contacting the die bonding pad 21. In this case the second level land 23 is formed at the same time as are the second level pads and pad leads with successive layers of chromium, copper and gold.

Figure 5:
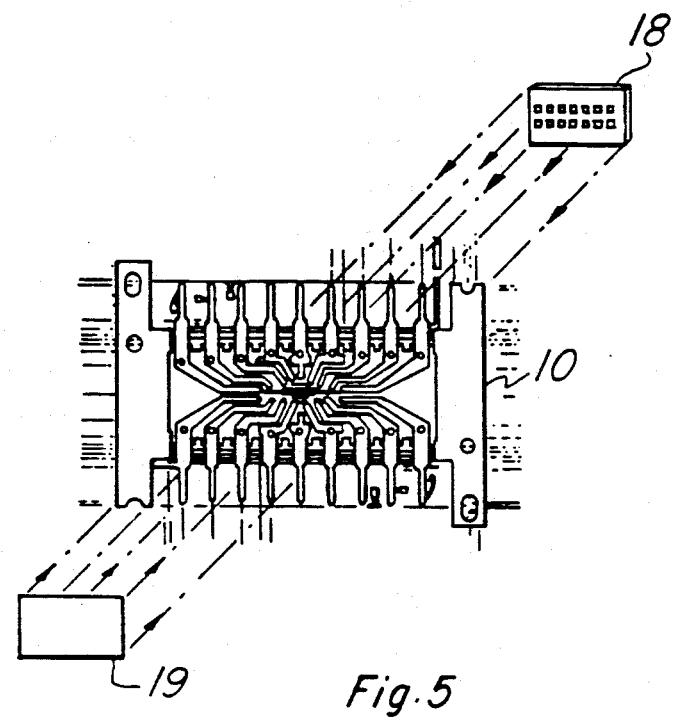
FIG. 5 is an exploded perspective view of the lead frame and dies in assembled form.
Figure 6:
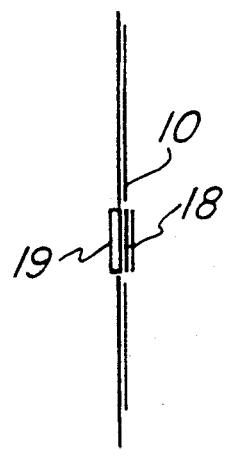
FIG. 6 is an end view of the two dies and lead frame in assembled form.

Next, the frame pads 15 are sandwiched between and aligned with the secondary bonding pads of bars 18 and 19 as shown in FIGS. 5 and 6.

A vapour phase solder process is used to weld the pads and frame pads together. Alternatively, an electrically conductive epoxy can be used in place of solder. Next the individual bars are encapsulated in an insulating package material 54 and their lead pins trimmed and bent to shape.

For a 256K DRAM the pin configurations are as set forth below:

TABLE 1

| Pin No. | Secondary pads Die 18 | Secondary pads Die 19 | Pads in Common? | Pin Code | Pin Description |
|---|---|---|---|---|---|
| 20 | 20a | 20b | Yes | A8 | Address 8 |
| 22 | 22a | 22b | No | DT | Data-In die 18 |
| 24 | 24a | 24b | No | DM | Data-In die 19 |
| 26 | 26a | 26b | Yes | $\overline{W}$ | Write enable |
| 28 | 28a | 28b | Yes | $\overline{RAS}$ | Row address strobe |
| 30 | 30a | 30b | Yes | A0 | Address 0 |
| 32 | 32a | 32b | Yes | A2 | Address 2 |
| 34 | 34a | 34b | Yes | A1 | Address 1 |
| 36 | 36a | 36b | Yes | Vdd | 5 volt supply |
| 40 | 40a | 40b | Yes | A7 | Address 7 |
| 42 | 42a | 42b | Yes | A5 | Address 5 |
| 44 | 44a | 44b | Yes | A4 | Address 4 |
| 46 | 46a | 46b | Yes | A3 | Address 3 |
| 48 | 48a | 48b | Yes | A6 | Address 6 |
| 50 | 50a | 50b | No | QT | Data-Out die 18 |
| 52 | 52a | 52b | Yes | $\overline{CAS}$ | Column address strobe |
| 54 | 54a | 54b | No | QM | Data-Out die 19 |
| 56 | 56a | 56b | Yes | Vss | Substrate (ground) voltage |

With the configuration of pins as set forth in Table 1 a 256K DRAM set of two dies operates as a 256K×2 memory device. Dummy pad 24a ensures that data on this pin enters only die 19 while dummy pad 22b ensures that data on this pin enter only die 18. Similarly, dummy pad 50b ensures that data on this pin comes only from die 18 while dummy pad 54a ensures that data on this pin comes only from die 19. Pins 58a and 58b may optionally be coupled to the back of the dies 18 and 19, respectively. As seen in table 1, all of the pairs of second level pads of dies 18 and 19 corresponding to second level pads of like numbers are in common except for two pads on each of dies 18 and 19, which form a pair of semiconductor circuit dies. Using second level pads 24a and 54a as dummy pads ensures that data input on pin 24 goes only to the Data-In of bar 19 and data is outputted on pin 54 only from the Data-Out of die 19. Similarly, using second level pads 22b and 50b ensures that data input on pin 22 enters the Data-In only of die 18 and only data outputted from the Data-Out of die 18 appears on pin 50. Identical connections can be used for DRAM's of higher (or Lower) memory capacity.

Alternatively, two 256K DRAMS may also be connected in a 512K×1 configuration by simply making a dummy pad on die 19 to align with the $\overline{RAS}$ pad of die 18 and a dummy pad on die 18 to align with the $\overline{RAS}$ pad of die 19. All other pads of like function of dies 18 and 19 would be connected together and to a corresponding pin of the lead frame 10. The row address strobe of die 18 would enable only die 18 while that for die 19 would enable only die 19. The same principal can be applied to memory devices of a higher memory capacity such as a 1 megabit DRAM converting it into either a 2 megabit×1 DRAM or into a 1 megabit×2 DRAM. With a slight increase in the amount of processing and very little increased cost it is possible to expand the memory capacity of a device for a given package size.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A process of making a packaged semiconductor integrated circuit, comprising:
   a. making a pair of semiconductor integrated circuit dies that each have an active face and that each have plural die bonding pads at least peripheral to said active faces;
   b. depositing a second level metal layer onto each said active face and over said plural die bonding pads;
   c. patterning and etching said second level metal layer into a plurality of second level bonding pads, a plurality of second level bonding lands and second level leads interconnecting said second level pads and corresponding second level lands, said patterning and etching including contacting associated die bonding pads with each second level land and arranging said second level bonding pads on each die in a mirror image of one another;
   d. forming a lead frame with a plurality of pins and with a plurality of frame pads connected to corresponding pins, said forming including aligning said frame pads with corresponding second level bonding pads of said dies;
   e. bonding said second level bonding pads of said dies to respective frame pads by arranging said pair of dies on opposite sides of said lead frame; and
   f. encapsulating said bonded together dies and lead frame in packaging material, said encapsulating including trimming and shaping the lead frame pins.

2. The process of claim 1 in which said patterning and etching includes making said second level bonding pads at least 400 square mils in area.

3. The process of claim 1 in which said depositing includes depositing a layer of chromium followed by a layer of copper followed by a layer of gold.

4. The process of claim 3 in which said depositing includes depositing said layers of chromium copper and gold respectively to thicknesses of 1,000; 5,000; and 8,000 angstroms.

5. The process of claim 1 in which said making includes making DRAMS and said patterning and etching includes patterning and etching dummy second level bonding pads on each die that correspond to Data-in and Data-out second level bonding pads on the other die.

6. The process of claim 1 in which said making includes making DRAMS and said patterning and etching includes patterning and etching a dummy second level bonding pad on each die that corresponds to a row address strobe second level bonding pad on the other die.

7. A process of making a semiconductor die adapted to be bonded to one side of a lead frame that has a similar semiconductor die bonded to the other side of said lead frame, said lead frame having a plurality of pins and having a plurality of frame bonding pads interconnected with corresponding respective pins, said process comprising:
   a. making a semiconductor die with an active face, and with plural spaced apart die bonding pads on said active face arranged identical to corresponding plural bonding pads on a similar active face of said similar semiconductor die;
   b. creating plural spaced apart second level bonding lands overlying and contacting corresponding ones of said die bonding pads;
   c. effecting plural spaced apart second level bonding pads on said active face, said second level bonding pads adapted to be bonded to desired frame bonding pads, and being arranged in a mirror image to corresponding plural spaced apart second level bonding pads on said similar active face of said similar semiconductor die; and
   d. producing plural second level leads interconnecting corresponding ones of said second level bonding lands and second level bonding pads, said producing including arranging said second level leads different from corresponding plural second level leads interconnecting, at least partly, said plural bonding pads on said similar active face and said second level bonding pads on said similar active face.

8. The process of claim 7 in which said effecting includes effecting the area of said second level bonding pads on said active face to be at least 400 square mils.

9. The process of claim 7 in which said effecting and producing includes forming at least said second level pads and leads of a layer of chromium under a layer of copper under a layer of gold.

10. The process of claim 7 in which said making makes a die that is a DRAM and said similar die is a DRAM, and said effecting second level bonding pads on said active face includes effecting dummy pads arranged in a mirror image to the Data-in and Data-out second level bonding pads on said similar active face.

11. The process of claim 7 in which said making makes a die that is a DRAM and said similar die is a DRAM, and said effecting second level bonding pads on said active face includes effecting a dummy pad arranged in a mirror image to a row address strobe second level bonding pad on said similar active face.

12. A process of making a semiconductor integrated circuit device comprising:
   a. providing a lead frame having a plurality of pins and having a plurality of frame bonding pads interconnected with corresponding respective pins, the frame bonding pads being capable of bonding on opposite sides of said lead frame;
   b. making at least one pair of semiconductor integrated dies, each die having bonding pads arranged in mirror image of one another, and having pad leads on each die interconnecting corresponding die bonding pads and bonding lands;
   c. bonding the pair of dies on opposite sides of said lead frame by bonding said bonding pads of each die to corresponding frame bonding pads; and
   d. encapsulating said dies, frame bonding pads and at least a part of each of said pins with insulating material.

13. The process of claim 12 in which said making includes making dies to be DRAMS.

14. The process of claim 12 in which said making includes making each of said dies to have Data-in and Data-out bonding pads and further making the Data-in and Data-out bonding pads of the pair of dies separate from one another during said bonding to said frame bonding pads.

15. The process of claim 12 in which said making includes making said dies to have Data-in bonding pads arranged to be bonded to the same frame bonding pad and Data-out bonding pads arranged to be bonded to the same frame bonding pad, and the pair of dies each having a row address strobe bonding pad arranged to be bonded to frame bonding pads separate from one another.

16. The process of claim 12 in which said making makes each of said dies to be 256K DRAMS and said bonding bonds said bonding pads to said frame bonding pads in a configuration of a 256×2 memory device.

17. The process of claim 12 in which said making makes each of said dies to be 256K DRAMS and said bonding bonds said bonding pads to said frame bonding pads in a configuration of a 512×1 memory device.

18. The process of claim 12 in which said making makes each of said dies to be 1 megabit DRAMS and said bonding bonds said bonding pads to said frame bonding pads in a configuration of a 1 megabit ×2 memory device.

19. The process of claim 12 in which said making makes each of said circuit bars to be 1 megabit DRAMS and said bonding bonds said bonding pads to said frame bonding pads in a configuration of a 2 megabit ×1 memory device.

20. The process of claim 7 in which said making makes said die to be a 256K DRAM and said effecting effects second level bonding pads on said active face adapted to be bonded to said frame bonding pads in a configuration of a 256K×2 memory device.

21. The process of claim 7 in which said making makes said die to be a 256K DRAM and said effecting effects second level bonding pads on said active face adapted to be bonded to said frame bonding pads in a configuration of a 512×1 memory device.

22. The process of claim 7 in which said making makes said die to be a 1 megabit DRAM and said effecting effects said second level bonding pads on said active face adapted to be bonded to said frame bonding pads in a configuration of a 1 megabit ×2 memory device.

23. The process of claim 7 in which said making makes said die to be a 1 megabit DRAM and said effecting effects said second level bonding pads on said active face adapted to be bonded to said frame bonding pads in a configuration of a 2 megabit ×1 memory device.

* * * * *